(12) United States Patent
Bacaksiz et al.

(10) Patent No.: US 9,306,562 B2
(45) Date of Patent: Apr. 5, 2016

(54) HOUSEHOLD APPLIANCE COMPRISING TOUCH SENSORS

(71) Applicant: Arcelik Anonim Sirketi, Istanbul (TR)

(72) Inventors: Mucahit Bacaksiz, Istanbul (TR);
Ahmet Ihsan Yuce, Istanbul (TR)

(73) Assignee: ARCELIK ANONIM SIRKETI, Istanbul (TR)

( * ) Notice: Subject to any disclaimer, the term of this patent is extended or adjusted under 35 U.S.C. 154(b) by 67 days.

(21) Appl. No.: 14/351,520

(22) PCT Filed: Oct. 11, 2012

(86) PCT No.: PCT/EP2012/070117
§ 371 (c)(1),
(2) Date: Apr. 11, 2014

(87) PCT Pub. No.: WO2013/053791
PCT Pub. Date: Apr. 18, 2013

(65) Prior Publication Data
US 2014/0284196 A1 Sep. 25, 2014

(30) Foreign Application Priority Data

Oct. 11, 2011 (TR) .............................. a 2011 10097

(51) Int. Cl.
*H03K 17/96* (2006.01)
*H03K 17/955* (2006.01)

(52) U.S. Cl.
CPC .......... *H03K 17/9622* (2013.01); *H03K 17/955* (2013.01); *H03K 2217/94094* (2013.01); *H03K 2217/960765* (2013.01)

(58) Field of Classification Search
CPC ................................. H05K 3/36; H03K 17/96
USPC ..................................... 200/600; 349/12, 150
See application file for complete search history.

(56) References Cited

U.S. PATENT DOCUMENTS

| | | | |
|---|---|---|---|
| 7,987,594 B1 * | 8/2011 | Farole et al. | 29/884 |
| 2006/0038791 A1 | 2/2006 | MacKey | |
| 2010/0044122 A1 | 2/2010 | Sleeman et al. | |
| 2010/0214247 A1 * | 8/2010 | Tang et al. | 345/173 |
| 2011/0214978 A1 * | 9/2011 | Byrne et al. | 200/600 |

* cited by examiner

*Primary Examiner* — Edwin A. Leon
*Assistant Examiner* — Iman Malakooti
(74) *Attorney, Agent, or Firm* — Venjuris P.C.

(57) ABSTRACT

The present invention relates to a household appliance (1) comprising a panel (2) which is produced from at least partially electrically conductive material, a transparent non-conductive plate (3) which is placed onto the panel (2), more than one sensor (4) which is located on the non-conductive plate (3) and detects the touch of the user on the non-conductive plate (3), a circuit board (5) which evaluates the signals received from the sensor (4) and controls the operation of the household appliance (1) according to these signals, and at least one transmission element (6) which transmits the signals received from the sensor (4) to the circuit board (5).

17 Claims, 2 Drawing Sheets

HOUSEHOLD APPLIANCE COMPRISING TOUCH SENSORS

Figure 1:
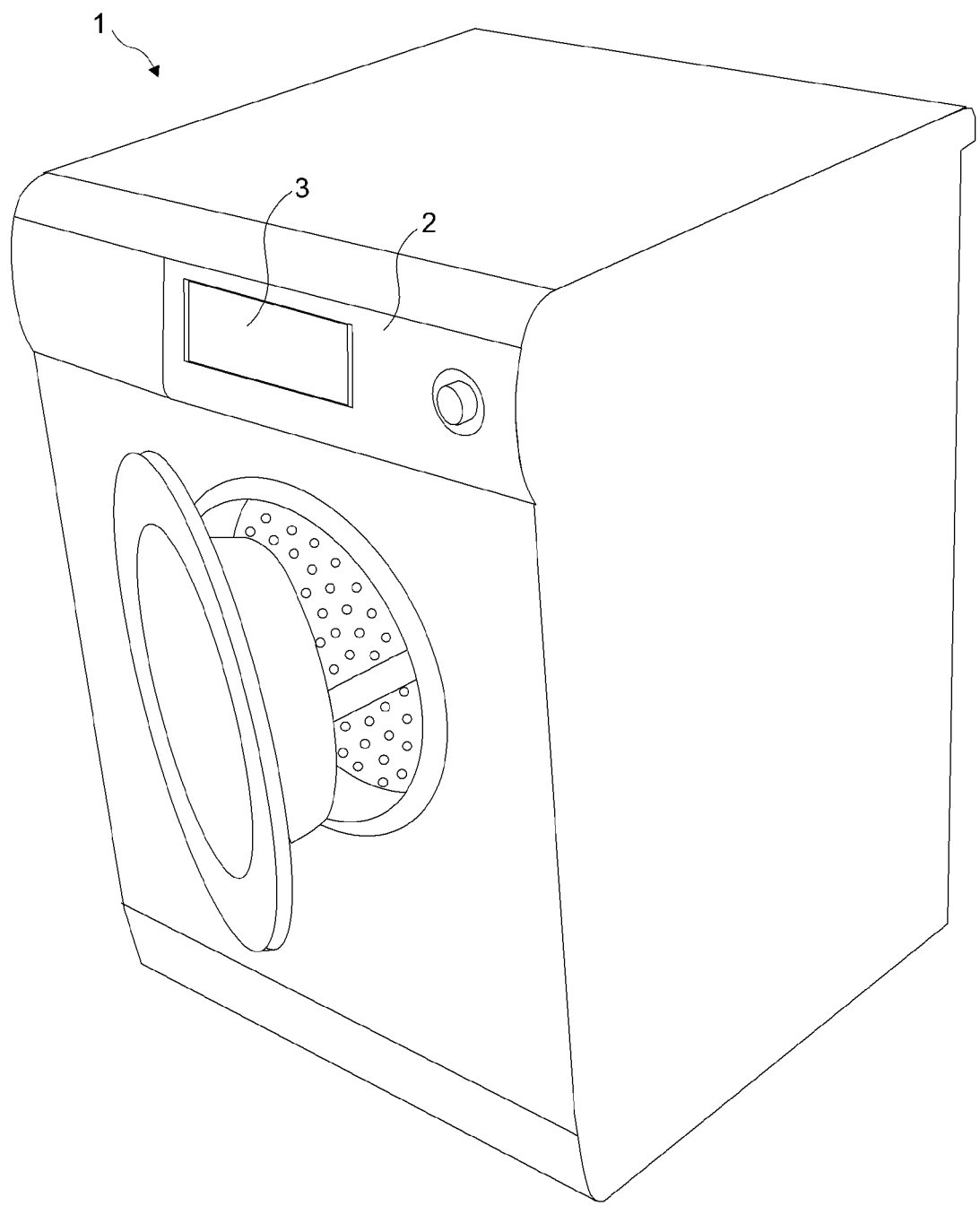

The present invention relates to a household appliance comprising a touch sensor.

Nowadays, household appliances comprising control panels with touch sensors are preferred because of their ease of use and esthetic appearance. These sensors are placed on the surface of a non-conductive plate and when the user contacts the non-conductive plate, the electric field of the contacted point is changed. The change occurred in the electric field is evaluated by the electronic control unit connected to the sensor. However, touch sensors are affected by the electromagnetic interference generated by other conductive materials around them that emit electric field. With the effect of the electromagnetic interference generated by the conductive materials, the signals received and sent by more than one side by side touch sensors cross talk and when one touch sensor is touched, the other touch sensors are also affected. As a result of this, the command desired to be entered by the user is changed and this causes the need to repeat the operation.

In the state of the art United States Patent Application No. US2010044122, the sensing capabilities of the sensors are provided to be improved by forming small gaps between the drive electrodes arranged side by side.

The aim of the present invention is the realization of a household appliance comprising a touch sensor, the detection precision of which is improved.

The household appliance realized in order to attain the aim of the present invention, explicated in the first claim and the respective claims thereof, comprises a panel which has an at least partially conductive surface, a non-conductive plate placed onto the panel, more than one touch sensor placed onto the non-conductive plate, a transmission element which transmits the signals generated by the user touching the non-conductive plate, and a circuit board which evaluates the signals received from the sensor and controls the operation of the appliance according to these signals.

The household appliance of the present invention comprises at least one spacer which is placed between the electrically conductive portion of the panel and the transmission element and which forms a gap between the electrically conductive portion of the panel and the transmission element.

When the user touches the non-conductive plate located on the panel, he/she changes the electric field of the touch sensors. The electric field change information detected by the touch sensors is transmitted to the control unit by means of the transmission element, one end of which is connected to the touch sensor and the other end to the electronic card. The control unit provides the user to operate the household appliance according to the received information by applying the commands selected by the user. By means of the spacer placed between the transmission element and the electrically conductive portion of the panel, the transmission element is prevented from contacting the conductive portion of the panel. Thus, the electromagnetic interference to be generated by the conductive portion of the panel is prevented and hence, the touch sensors are enabled to operate more precisely.

In an embodiment of the present invention, a capacitive touch sensor is used as a touch sensor. Thus, signal generated in more than one coordinate on the touch sensor is provided to be detected.

In another embodiment of the present invention, non-conductive materials are used in the production of the spacer. Since there is no electricity transmission in non-conductive materials, formation of electromagnetic interference is prevented.

In another embodiment of the present invention, the spacer is produced from polymeric material in suitable forms. Polymeric materials are used in spacer production since they are low-cost materials that have non-conductive properties and provide ease of processing.

In another embodiment of the present invention, the spacer is produced in rectangular prism form. Thus, costs of mold used in production are decreased and ease of production is provided.

In yet another embodiment of the present invention, the spacer is produced in half-cylinder form. Thus, the spacer of the present invention is enabled to be produced in a cheaper and easier manner.

In the household appliance of the present invention, the transmission element is provided to be removed from the conductive portion of the panel by means of the spacer placed between the transmission element and the electrically conductive portion of the panel. Thus, the effect to be formed on the touch sensors by the electromagnetic interference, generated by the present electric field of the conductive portion of the panel, is reduced, and the cross-talk problem to occur in touch sensors is prevented. Accordingly, the detection precision of the touch sensors is improved.

In another embodiment of the present invention, the household appliance is a cooker.

In another embodiment of the present invention, the household appliance is an oven.

In another embodiment of the present invention, the household appliance is a washing machine.

In another embodiment of the present invention, the household appliance is a laundry dryer.

In another embodiment of the present invention, the household appliance is a dishwasher.

In another embodiment of the present invention, the household appliance is a refrigerator.

The household appliance realized in order to attain the aim of the present invention is illustrated in the attached figures, where:

FIG. 1—is the schematic view of a household appliance in an embodiment of the present invention.

Figure 2:
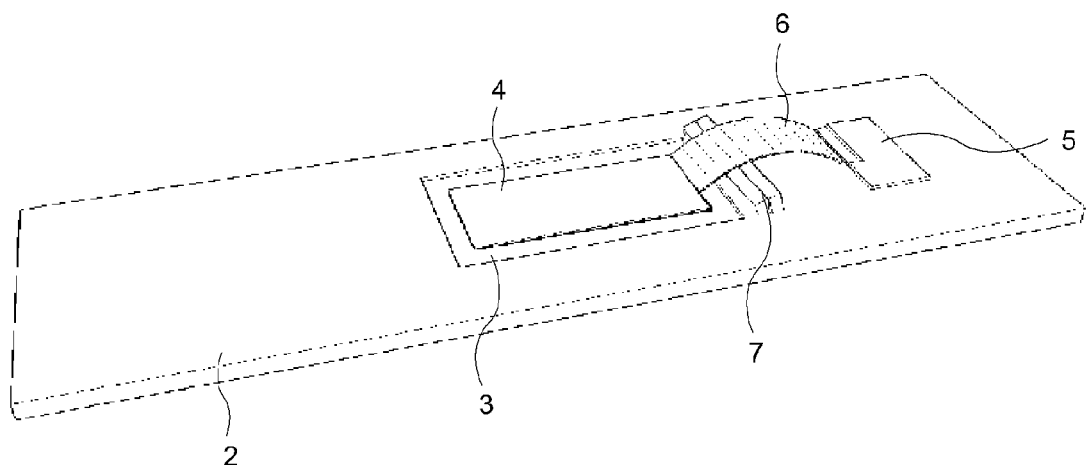

FIG. 2—is the schematic view of the panel, the non-conductive plate, the sensor, the transmission element and the circuit board all together.

Figure 3:
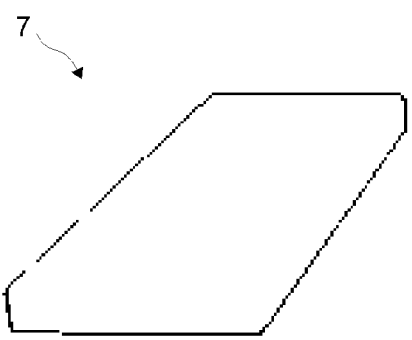

FIG. 3—is the schematic view of an embodiment of a spacer.

Figure 4:
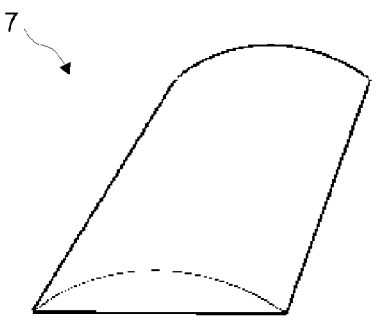

FIG. 4—is the schematic view of another embodiment of a spacer.

The elements illustrated in the figures are numbered as follows:

1. Household appliance
2. Panel
3. Non-conductive plate
4. Sensor
5. Circuit board
6. Transmission element
7. Spacer The household appliance (1) comprises a panel (2) which is produced from at least partially electrically conductive material, a non-conductive plate (3) which is placed onto the panel (2), more than one sensor (4) which is located on the non-conductive plate (3) and detects the touch of the user on the non-conductive plate (3), a circuit board (5) which evaluates the signals received from the sensor (4) and controls the operation of the household appliance (1) according to these signals, and at least one transmission element (6) which transmits the signals received from the sensor (4) to the circuit board (5).

The household appliance (1) of the present invention comprises at least one spacer (7) which is placed between the panel (2) portion produced from electrically conductive material and the transmission element (6) and prevents the transmission element (6) from contacting the panel (2) portion produced from electrically conductive material (FIG. 1, FIG. 2).

In the household appliance (1) of the present invention, the user touches the non-conductive plate (3), placed onto the panel (2), in order to enter the commands suitable for the program he/she desires to operate. With the effect of touching, the voltage value, therefore, the electric field of the touch sensors (4) change which, when there is no contact, has no voltage value, in other words, the voltage value of which is zero. The information about the changing voltage value of the touch sensors (4) is transmitted to the circuit board (5) by means of a transmission element (6), one end of which is connected to the sensors (4) and the other end to the circuit board (5). The circuit board (5) determines the command entered by the user according to the change information received from the touch sensors (4) and operates the functions of the household appliance (1) in compliance with these commands.

In the household appliance (1) of the present invention, at least one spacer (7) is placed between the panel (2) portion produced from electrically conductive material and the transmission element (6). Thus, the spacer (7) provides the distance between the transmission element (6) and the electrically conductive metal surface of the panel (2) to increase, in other words, removes the transmission element (6) from the panel (2) portion produced from electrically conductive material. Accordingly, the electromagnetic interferences to be generated by the electric field of the panel (2) portion produced from conductive material are prevented from impairing the precision of the touch sensors (4) and the cross-talk problem to occur in touch sensors (4) is reduced.

In another embodiment of the present invention, the touch sensor (4) has a capacitive sensing feature. Capacitive touch sensors are preferred since they have the capability to sense at more than one area on their surface and provide ease of calibration.

In another embodiment of the present invention, the spacer (7) is produced from non-conductive material. Since the non-conductive material does not have the capability to transmit electricity, it does not form electric fields and therefore, electromagnetic interferences are prevented from being generated.

In another embodiment of the present invention, the spacer (7) is produced from polymeric material. Polymeric materials are long-lasting and low-cost materials that have non-conductive properties and that can be processed easily. Furthermore, they provide ease of use and production.

In another embodiment of the present invention, the spacer (7) is produced in rectangular prism form. Thus, costs of mold are decreased and therefore, the opportunity for an economical production is provided (FIG. 3).

In yet another embodiment of the present invention, the spacer (7) is produced in half-cylinder form. Thus, the spacer (7) is provided to be produced in a low-cost and easy manner (FIG. 4).

In another embodiment of the present invention, the household appliance (1) is a cooker.

In another embodiment of the present invention, the household appliance (1) is an oven.

In another embodiment of the present invention, the household appliance (1) is a washing machine.

In another embodiment of the present invention, the household appliance (1) is a laundry dryer.

In another embodiment of the present invention, the household appliance (1) is a dishwasher.

In another embodiment of the present invention, the household appliance (1) is a refrigerator.

In the household appliance (1) of the present invention, the contact between the transmission element (6) and the electrically conductive portion of the panel (2) is lost by means of the spacer (7) located between the panel (2) portion produced from electrically conductive material and the transmission element (6), and the electromagnetic interferences and noise to be generated by the electric field of the electrically conductive portion of the panel (2) are prevented. Accordingly, the detection performance of the touch sensors (4) is enabled to be improved.

It is to be understood that the present invention is not limited by the embodiments disclosed above and a person skilled in the art can easily introduce different embodiments. These should be considered within the scope of the protection postulated by the claims of the present invention.

The invention claimed is:

1. A household appliance (1) comprising
   a panel (2) which is produced from at least partially electrically conductive material,
   a non-conductive plate (3) which is placed onto the panel (2),
   more than one sensor (4) which is located on the non-conductive plate (3) and detects the touch of the user on the non-conductive plate (3),
   a circuit board (5) placed on the panel separately from the non-conductive plate and which evaluates the signals received from the sensor (4) and controls the operation of the household appliance (1) according to these signals, and
   at least one transmission element (6) which transmits the signals received from the more than one sensor (4) to the circuit board (5),
   and at least one spacer (7) which is placed on the panel (2) and between the panel (2) portion produced from electrically conductive material and the transmission element (6) and prevents the transmission element (6) from contacting the panel (2) portion produced from electrically conductive material.

2. The household appliance (1) as in claim 1, characterized by the touch sensor (4) with capacitive sensing feature.

3. The household appliance (1) as in claim 2, characterized by the spacer (7) that is produced from non-conductive material.

4. The household appliance (1) as in claim 3, characterized by the spacer (7) that is produced from polymeric material.

5. The household appliance (1) as in claim 4, characterized by the spacer (7) that is in rectangular prism form.

6. The household appliance (1) as in claim 4, characterized by the spacer (7) that is in half-cylinder form.

7. The household appliance (1) as in claim 1, which is a cooker.

8. The household appliance (1) as in claim 1, which is an oven.

9. The household appliance (1) as in claim 1, which is a washing machine.

10. The household appliance (1) as in claim 1, which is a laundry dryer.

11. The household appliance (1) as in claim 1, which is a dishwasher.

12. The household appliance (1) as in claim 1, which is a refrigerator.

13. The household appliance (1) as in claim 1, characterized by the spacer (7) that is produced from non-conductive material.

14. The household appliance (1) as in claim 1, characterized by the spacer (7) that is produced from polymeric material.

15. The household appliance (1) as in claim 1, characterized by the spacer (7) that is in rectangular prism form.

16. The household appliance (1) as in claim 1, characterized by the spacer (7) that is in half-cylinder form.

17. A household appliance (1) comprising
- a panel (2) having a first region and a second region which is produced from at least partially electrically conductive material,
- a non-conductive plate (3) which is placed onto the first region of the panel (2),
- more than one sensor (4) which is located on the non-conductive plate (3) and detects the touch of the user on the non-conductive plate (3),
- a circuit board (5) placed on the second region of the panel wherein the panel (2) is at least partially electrically conductive between the first region and the second region and which evaluates the signals received from the more than one sensor (4) and controls the operation of the household appliance (1) according to these signals, and
- at least one transmission element (6) which transmits the signals received from the sensor (4) to the circuit board (5),
- and at least one spacer (7) which is placed between the panel (2) portion produced from electrically conductive material and the transmission element (6) and prevents the transmission element (6) from contacting the panel (2) portion produced from electrically conductive material.

* * * * *